(12) United States Patent
Yang et al.

(10) Patent No.: US 9,419,001 B1
(45) Date of Patent: Aug. 16, 2016

(54) METHOD FOR FORMING CELL CONTACT

(71) Applicant: INOTERA MEMORIES, INC., Taoyuan (TW)

(72) Inventors: Sheng-Wei Yang, Taoyuan (TW); Tieh-Chiang Wu, Taoyuan (TW); Wen-Chieh Wang, Taoyuan (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/996,240

(22) Filed: Jan. 15, 2016

(51) Int. Cl.
*H01L 21/76* (2006.01)
*H01L 27/108* (2006.01)

(52) U.S. Cl.
CPC .... *H01L 27/10888* (2013.01); *H01L 27/10876* (2013.01); *H01L 27/10879* (2013.01); *H01L 27/108* (2013.01); *H01L 27/10844* (2013.01); *H01L 27/10855* (2013.01)

(58) Field of Classification Search
USPC .......................................... 438/424
See application file for complete search history.

(56) References Cited

U.S. PATENT DOCUMENTS

| 9,093,496 | B2* | 7/2015 | Jacob | H01L 21/76243 |
| 2010/0062579 | A1* | 3/2010 | Juengling | H01L 27/1087 438/424 |
| 2013/0207181 | A1* | 8/2013 | Lee | H01L 29/66742 257/329 |
| 2014/0061746 | A1* | 3/2014 | Cho | H01L 29/41741 257/306 |
| 2015/0214233 | A1* | 7/2015 | Tsui | H01L 27/10844 257/534 |
| 2015/0311123 | A1* | 10/2015 | Zhu | H01L 21/82382 257/401 |

* cited by examiner

*Primary Examiner* — Thanh T Nguyen
(74) *Attorney, Agent, or Firm* — Winston Hsu; Scott Margo

(57) ABSTRACT

A method for forming a cell contact. A substrate having first and second protruding structures is prepared. An etch stop layer is deposited over the substrate. A sacrificial layer is deposited on the etch stop layer. The sacrificial layer is recessed. Spacers are formed on the top surface of the sacrificial layer. A portion of the sacrificial layer not covered by the spacers is etched away, thereby forming a recess. A gap filling material layer is deposited into the recess. An upper portion of the gap filling material layer and the spacers are removed to expose the top surface of the sacrificial layer. The sacrificial layer is removed to form contact holes. A punch etching process is performed to remove the etch stop layer from bottoms of the contact holes. The contact holes is filled up with a conductive material layer.

10 Claims, 10 Drawing Sheets

METHOD FOR FORMING CELL CONTACT

BACKGROUND OF THE INVENTION

1. Field of the Invention

The present invention relates generally to a semiconductor device and a method of fabricating the same. More particularly, the present invention relates to an improved method for fabricating a cell contact for DRAM devices.

2. Description of the Prior Art

As known in the art, dynamic random access memory (DRAM) is a type of random-access memory that stores each bit of data in a separate capacitor within an integrated circuit. DRAM is usually arranged in a rectangular array of charge storage cells consisting of one capacitor and transistor per data bit.

Normally, each transistor of a DRAM cell comprises a gate, a drain region in a semiconductor substrate, and a source region spaced apart from the drain region. The gate is typically electrically connected to a word line. The source region is typically electrically connected to a digit line. The drain region is typically electrically connected to a capacitor through a cell contact structure.

Continued demand to shrink devices has facilitated the design of DRAM cells with greater density and smaller feature size and cell area. The dimension of the cell contact structure also shrinks dramatically, resulting in increased contact resistance and reduced process window. Damage to the active area (AA) during cell contact etching becomes problematic.

Therefore, there is a need in this technical field to provide an improved method for fabricating a cell contact for DRAM devices, which is capable of avoiding the above-mentioned prior art issues without increasing the complexity of the fabrication process.

SUMMARY OF THE INVENTION

It is one object of the invention to provide an improved method for forming split cell contact for DRAM devices in order to solve the above-mentioned prior art problems.

According to one aspect of the invention, a method for forming a cell contact is disclosed. A substrate having a first and a second protruding structures disposed on a major surface of the substrate is prepared. The major surface comprises a first cell contact region in close proximity to the first protruding structure and a second cell contact region in close proximity to the second protruding structure. A conformal etch stop layer is then deposited over the substrate. The etch stop layer conformally covers the first and second protruding structures and the first and second cell contact regions. A sacrificial layer is then deposited in a blanket manner on the etch stop layer. The sacrificial layer fills up a gap between the first and second protruding structures. The sacrificial layer is recessed such that top portions of the first and second protruding structures protrude from a top surface of the sacrificial layer.

Spacers are formed on the top surface of the sacrificial layer and on sidewalls of the protrudent top portions of the first and second protruding structures. Using the spacers as an etching hard mask, a portion of the sacrificial layer not covered by the spacers is etched away in a self-aligned manner, thereby forming a recess. A gap filling material layer is then deposited into the recess. A first planarization process is performed to remove an upper portion of the gap filling material layer and the spacers, and the protrudent top portions of the first and second protruding structures until the top surface of the sacrificial layer is exposed. The sacrificial layer is removed so as to form contact holes in place. A punch etching process is performed to remove the etch stop layer from bottoms of the contact holes, thereby exposing the first and second cell contact regions. The contact holes are filled up with a conductive material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings, in which.

Figure 1:
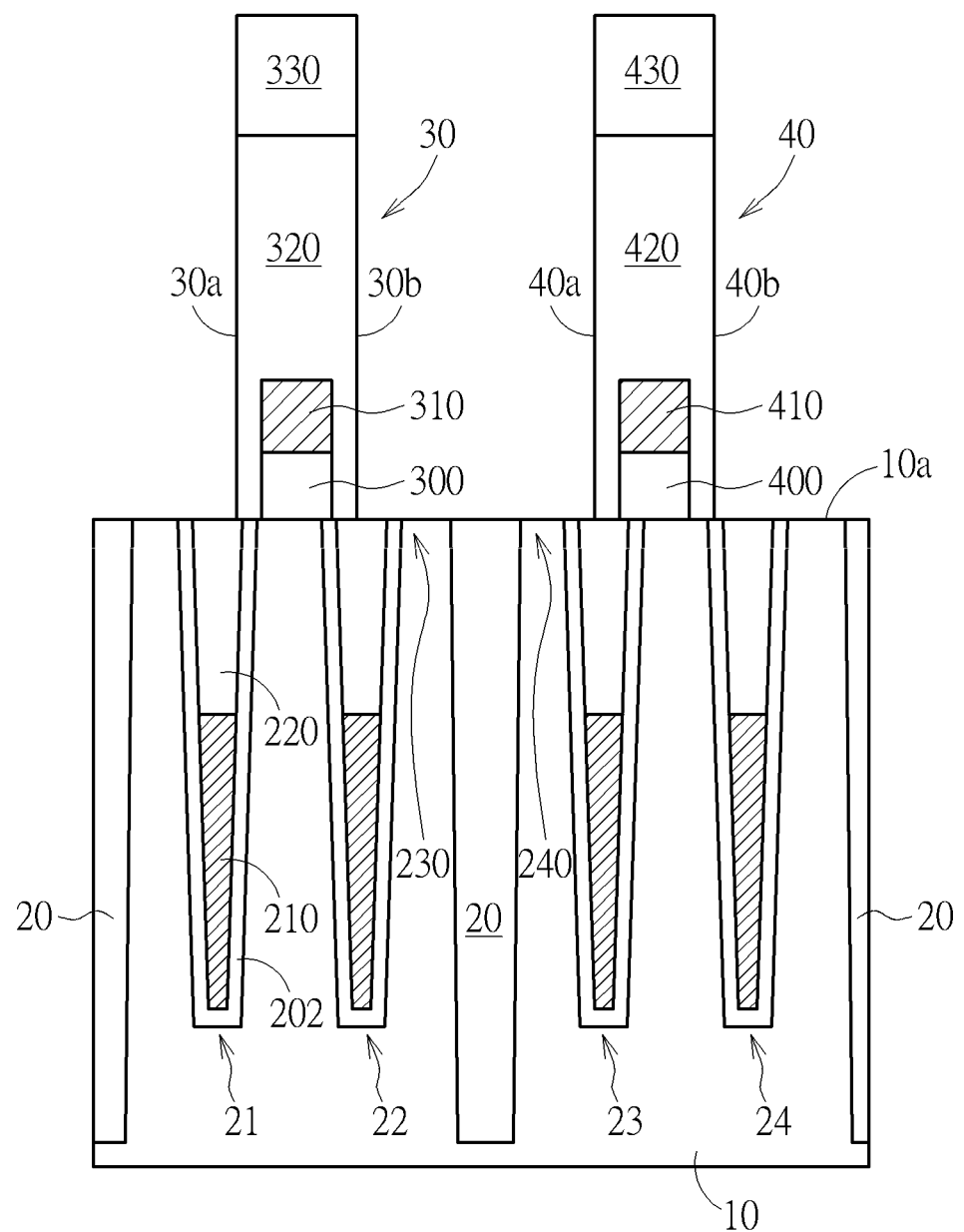
FIG. 1 to FIG. 10 are schematic, cross-sectional diagrams showing an exemplary method for fabricating a cell contact for a DRAM device in accordance with one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

With regard to the fabrication of transistors and integrated circuits, the term "major surface" refers to that surface of the semiconductor layer in and above which a plurality of transistors are fabricated. As used herein, the term "vertical" means substantially orthogonal with respect to the major surface. Typically, the major surface may be along a <100> plane of a monocrystalline silicon layer on which the field-effect transistor devices are fabricated.

FIG. 1 to FIG. 10 are schematic, cross-sectional diagrams showing an exemplary method for fabricating a cell contact for a DRAM device in accordance with one embodiment of the invention. As shown in FIG. 1, a semiconductor substrate 10 such as a silicon substrate is provided. It is to be understood that the semiconductor substrate 10 may be composed of any suitable semiconductor materials or wafers known in the art. The semiconductor substrate 10 has a major surface 10a, on which two upwardly protruding structures 30 and 40 are formed.

According to the illustrative embodiment, the two upwardly protruding structures 30 and 40 protrude from the major surface 10a and are disposed in close proximity to each other. When viewed from above, the upwardly protruding structures 30 and 40 may extend along a first direction and arranged parallel to each other. For example, when viewed from above, the upwardly protruding structures 30 and 40 may have a wave-shaped pattern, but is not limited thereto. It is to be understood that only two upwardly protruding structures are illustrated for the sake of simplicity.

According to the illustrative embodiment, the upwardly protruding structure 30 may comprise a silicon lower portion 300, a metal portion 310 directly on the silicon lower portion 300, and a silicon nitride layer 320 stacked on the metal portion 310 and covering at least the sidewalls of the metal portion 310. A silicon oxide layer 330 is stacked directly on the silicon nitride layer 320. Optionally, a silicon nitride liner (not explicitly shown) may be provided to cover the sidewalls of the silicon oxide layer 330 and the silicon nitride layer 320. The upwardly protruding structure 30 has two opposite sidewall surfaces 30a and 30b.

According to the illustrative embodiment, the upwardly protruding structure 40 may comprise a silicon lower portion 400, a metal portion 410 directly on the silicon lower portion 400, and a silicon nitride layer 420 stacked on the metal portion 410 and covering at least the sidewalls of the metal portion 410. A silicon oxide layer 430 is stacked directly on the silicon nitride layer 420. Optionally, a silicon nitride liner (not explicitly shown) may be provided to cover the sidewalls of the silicon oxide layer 430 and the silicon nitride layer 420. The upwardly protruding structure 40 has two opposite sidewall surfaces 40a and 40b.

It is to be understood that the upwardly protruding structures 30 and 40 are for illustration purposes only. According to the illustrative embodiment, the metal portion 310 directly on the silicon lower portion 300 and the metal portion 410 directly on the silicon lower portion 400 may function as digit lines of the DRAM device, but is not limited thereto.

When viewed from above, the silicon oxide layer 330 and the silicon oxide layer 430 may extend along a second direction and arranged parallel to each other. According to the illustrative embodiment, the first direction is perpendicular to the second direction, but is not limited thereto. According to the illustrative embodiment, the silicon oxide layers 330 and 430 may be formed by using spin-on-dielectric (SOD) materials, but is not limited thereto. The silicon oxide layers 330 and 430 are patterned layers and may both have a line-shaped pattern.

According to the illustrative embodiment, shallow trench isolation (STI) structure 20 and a plurality of trenched gate structures 21, 22, 23, and 24 may be provided in the semiconductor substrate 10 under the major surface 10a. 24. Each of the trenched gate structures 21, 22, 23, and 24 may comprise a gate dielectric layer 202, a conductive layer 210, and a cap layer 220. According to the illustrative embodiment, the trenched gate structures 21, 22, 23, and 24 may extend along the second direction, but is not limited thereto.

According to the illustrative embodiment, a cell contact region 230 is provided adjacent to the trenched gate structure 22 and a cell contact region 240 is provided adjacent to the trenched gate structure 23. It is to be understood that the arrangement of the STI structure 20 and the plurality of trenched gate structures 21, 22, 23, and 24 are for illustration purposes only.

Figure 2:
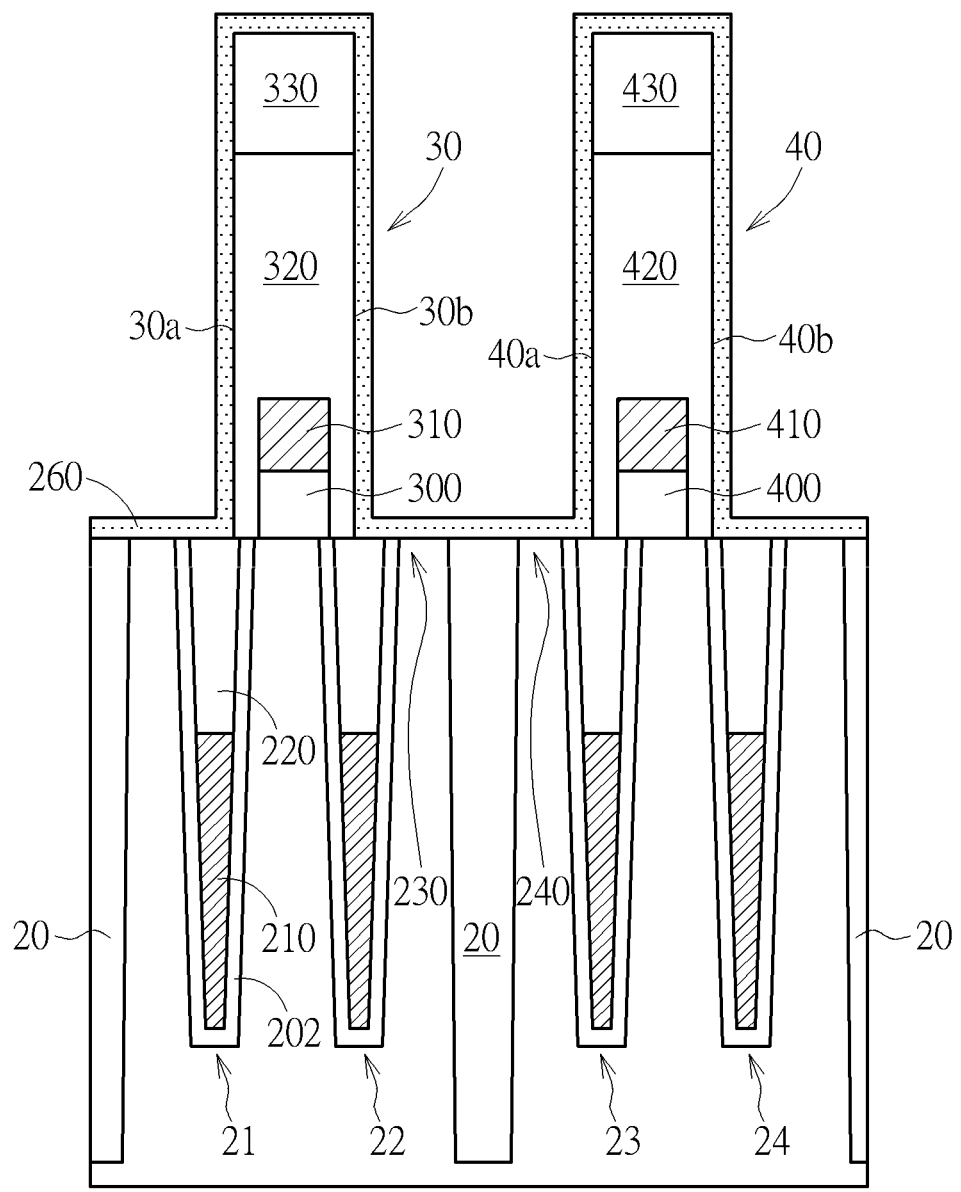

As shown in FIG. 2, according to the illustrative embodiment, a chemical vapor deposition (CVD) process or any suitable deposition method may be carried out to deposit a conformal etch stop layer 260 over the semiconductor substrate 10. The etch stop layer 260 conformally covers the two upwardly protruding structures 30 and 40, the silicon oxide layers 330 and 430, as well as the major surface 10a including the STI structure 20 and the cell contact regions 230 and 240. According to the illustrative embodiment, the etch stop layer 260 may comprise silicon nitride, but is not limited thereto.

Figure 3:
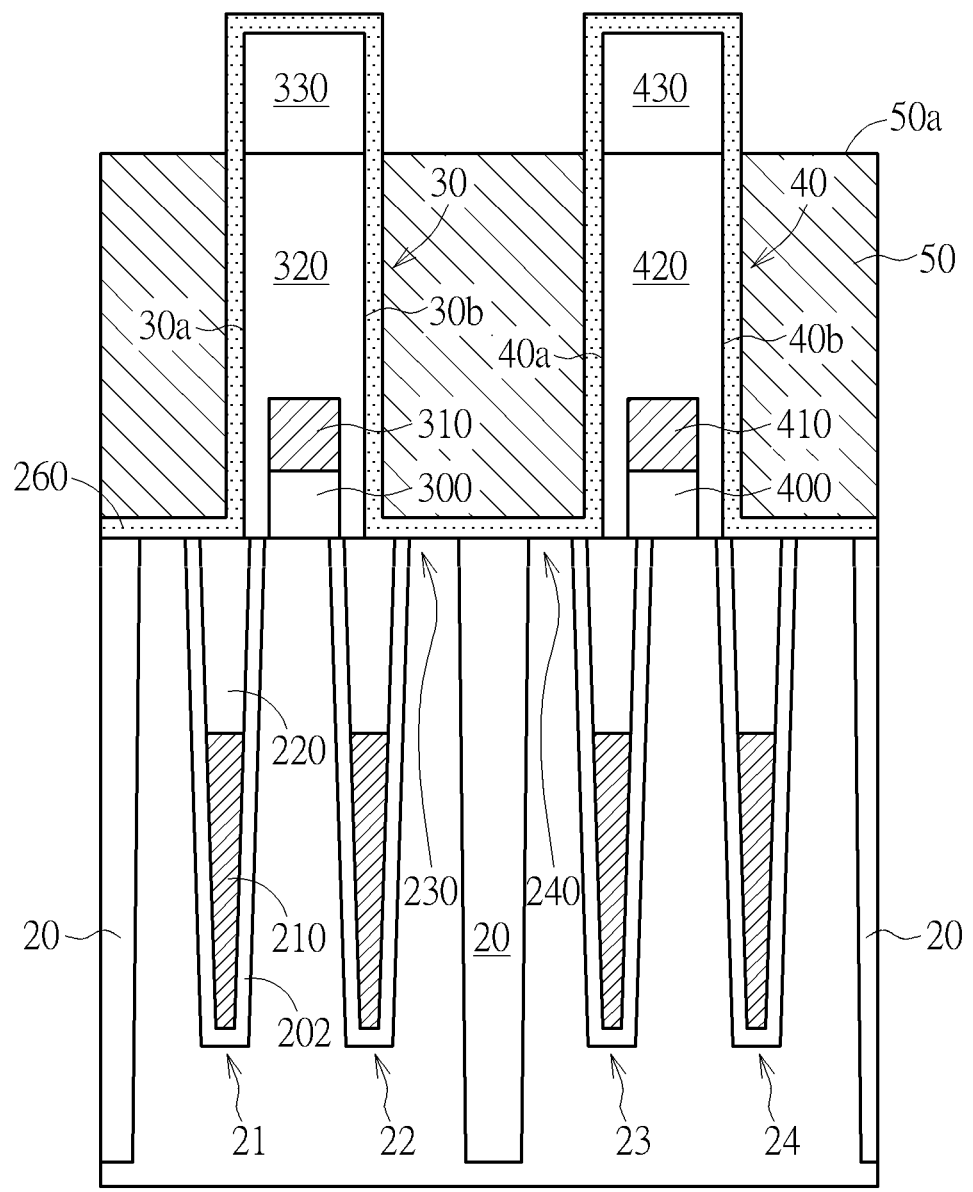

As shown in FIG. 3, according to the illustrative embodiment, a sacrificial layer 50 is deposited in a blanket manner on the etch stop layer 260. The sacrificial layer 50 fills up the gap or space between the upwardly protruding structures 30 and 40. According to the illustrative embodiment, the sacrificial layer 50 may comprise polysilicon, but is not limited thereto. Subsequently, the sacrificial layer 50 is recessed or etched back. For example, after the etch back of the sacrificial layer 50, the top surface 50a of the sacrificial layer 50 may be flush with or lower than bottom surfaces of the oxide layers 330 and 430. At this point, the silicon oxide layers 330 and 430 protrude from the top surface 50a of the sacrificial layer 50.

Figure 4:
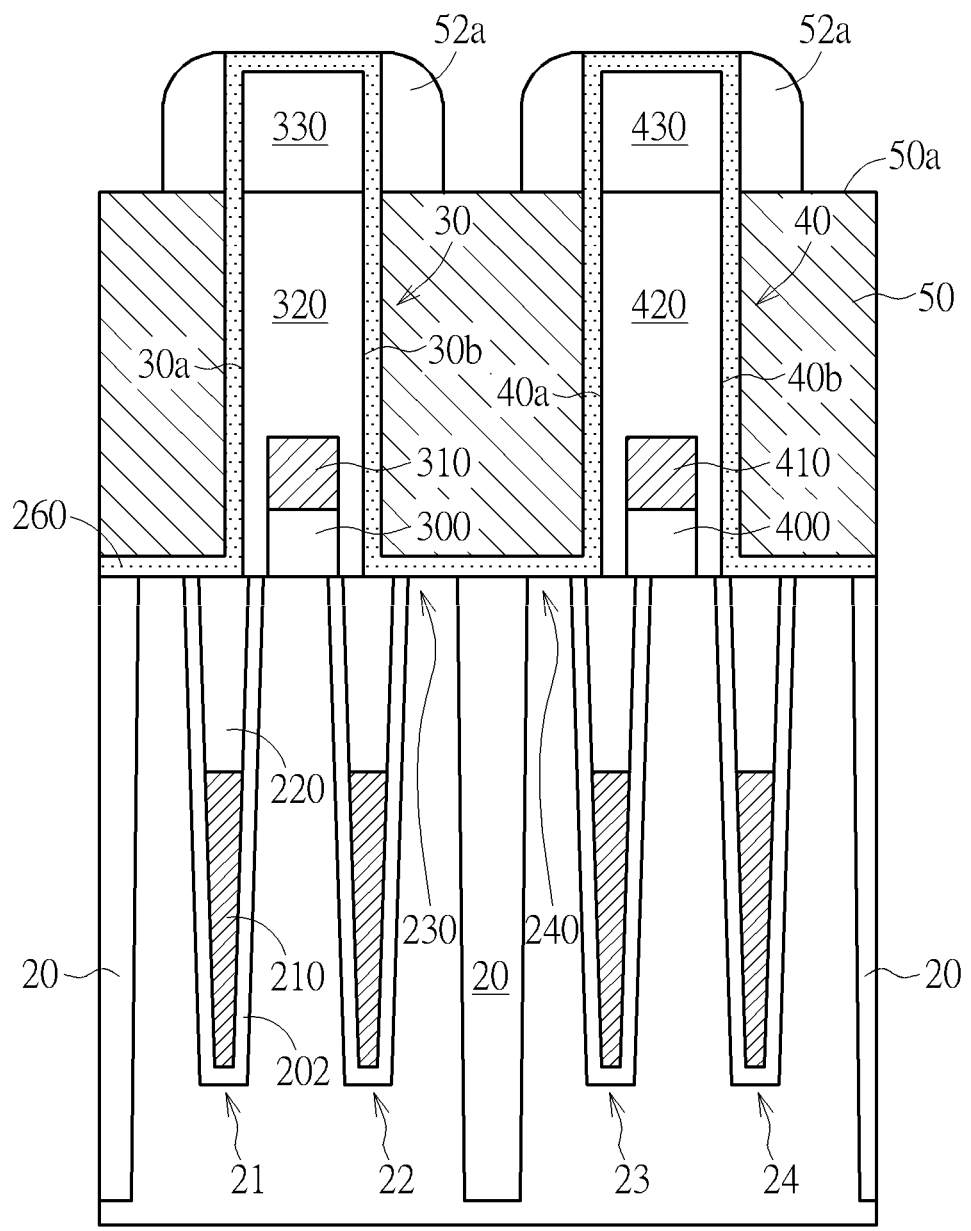

As shown in FIG. 4, according to the illustrative embodiment, another CVD process or deposition process is then performed to deposit a conformal spacer layer such as a silicon nitride layer on the top surface 50a of the sacrificial layer 50 and on the protrudent oxide layers 330 and 430. The thickness of the deposited spacer layer carefully controlled according to the desired target thickness of the cell contact to be formed in a later stage. Subsequently, an anisotropic dry etching process is performed to etch the spacer layer until the top surface 50a of the sacrificial layer 50 is exposed, thereby forming spaces 52a on two opposite sidewalls of the oxide layers 330 and 430.

Figure 5:
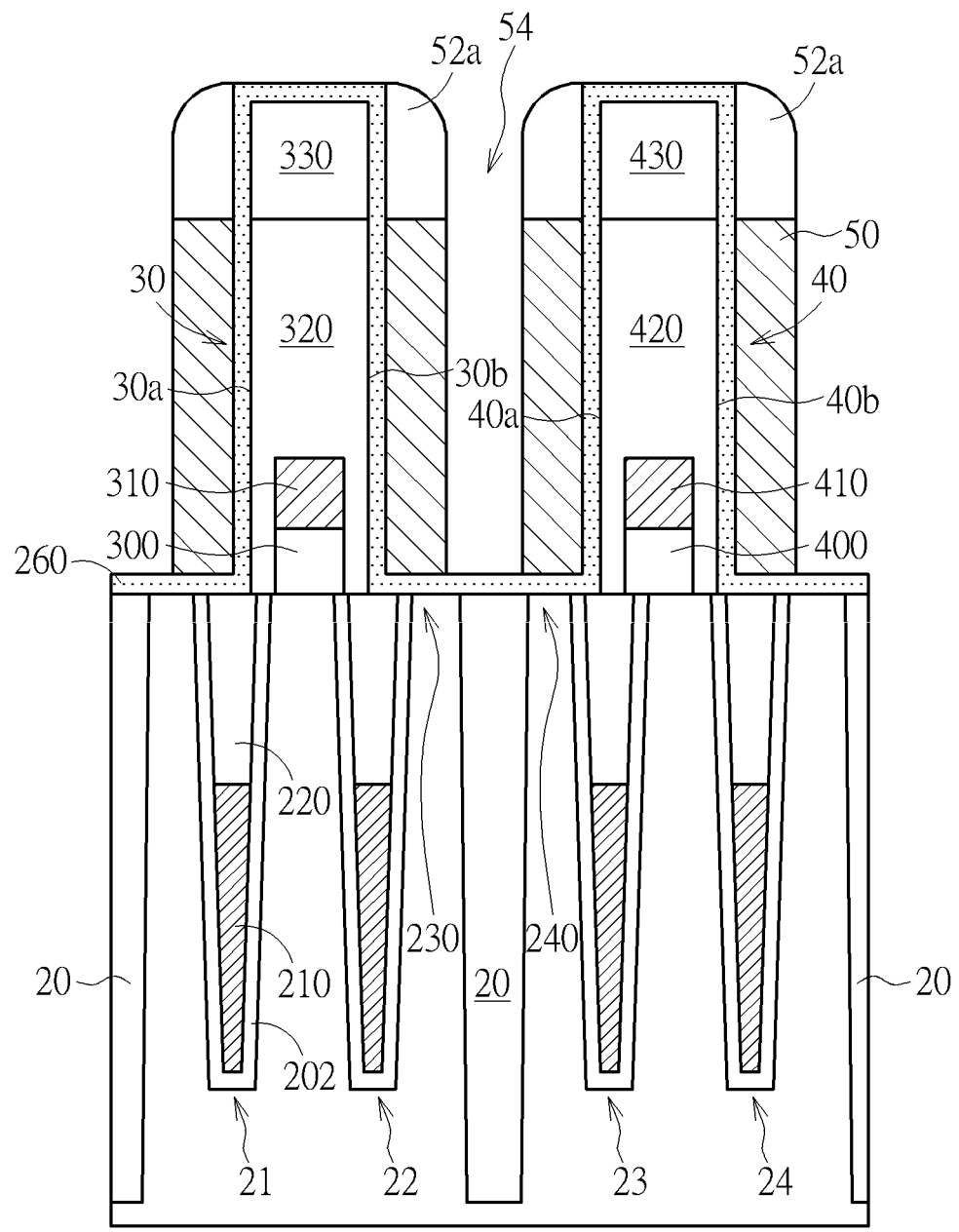

As shown in FIG. 5, according to the illustrative embodiment, another dry etching process may be performed, using the spacers 52a as an etching hard mask, to etch away a portion of the sacrificial layer 50 not covered by the spacers 52a in a self-aligned manner. The aforesaid dry etching process is selective to the underlying etch stop layer 260 to prevent damage to the active areas including the cell contact regions 230 and 240. After the separation of the sacrificial layer 50, a recess 54 is formed in the sacrificial layer 50. A top surface of the etch stop layer 260 is partially exposed at the bottom of the recess 54.

Figure 6:
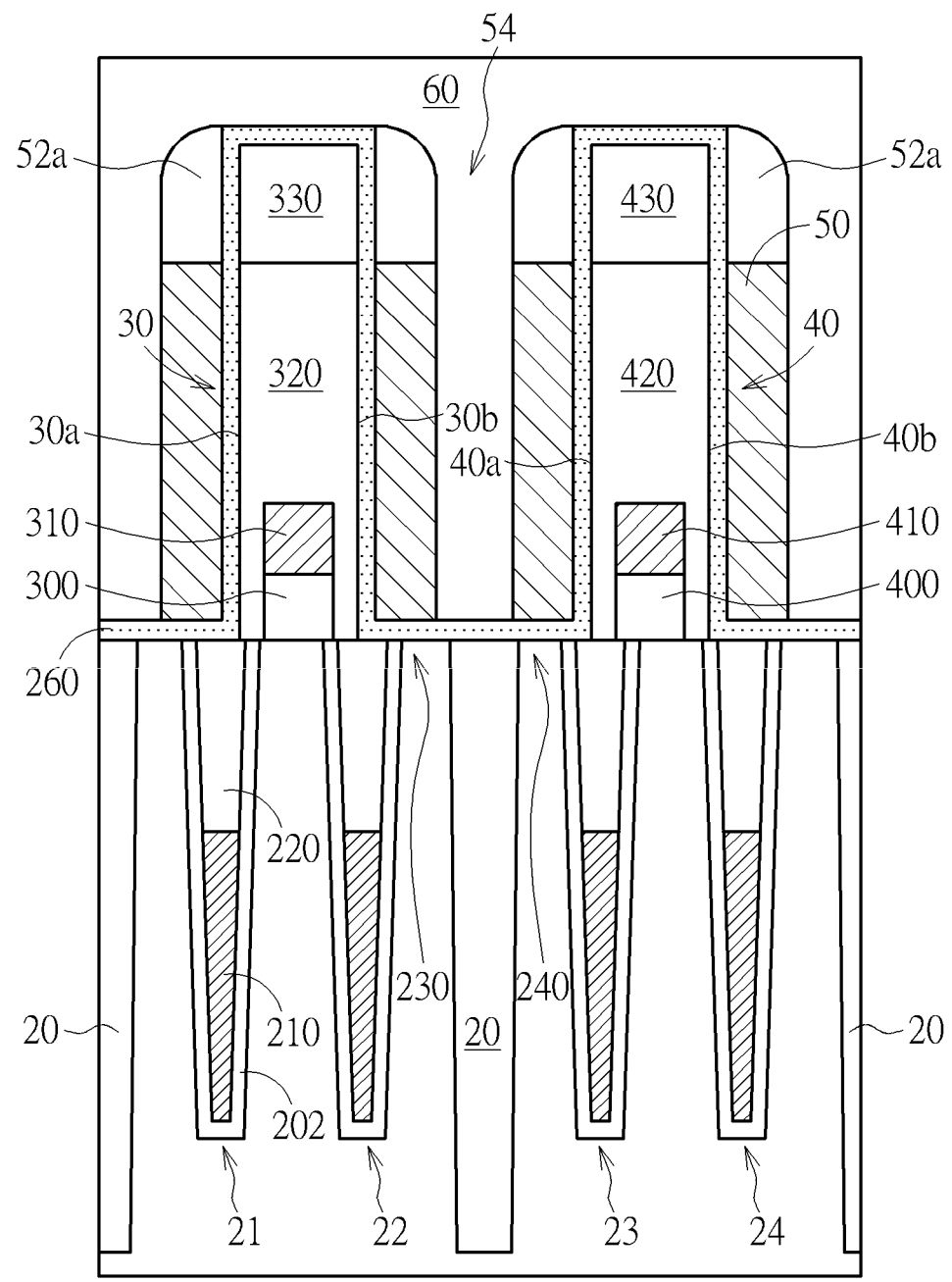

As shown in FIG. 6, subsequently, a gap filling material layer 60 is deposited into the recess 54. According to the illustrative embodiment, the gap filling material layer 60 may comprise silicon nitride, but is not limited thereto. The gap filling material layer 60 fills up the recess 54 and covers the spacers 52a.

Figure 7:
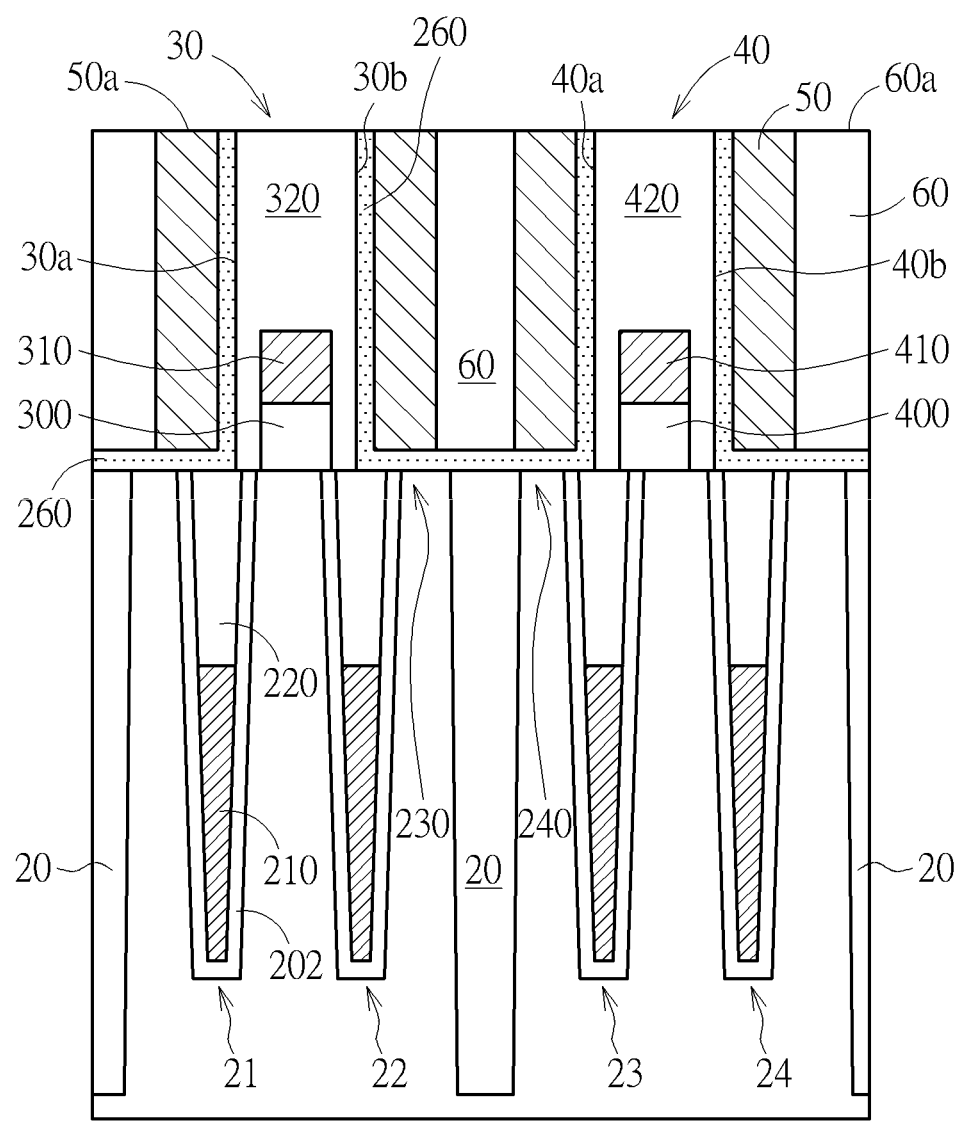

As shown in FIG. 7, according to the illustrative embodiment, a planarization process including, but not limited to, a polishing or an etching process, is performed to remove upper portions of the gap filling material layer 60, the spacers 52a, and the silicon oxide layers 330 and 430 until the top surface 50a of the sacrificial layer 50 is exposed. At this point, the top surface 50a of the sacrificial layer 50 may be flush with the top surfaces of the silicon nitride layers 320, 420, and the top surface 60a of the gap filling material layer 60.

Figure 8:
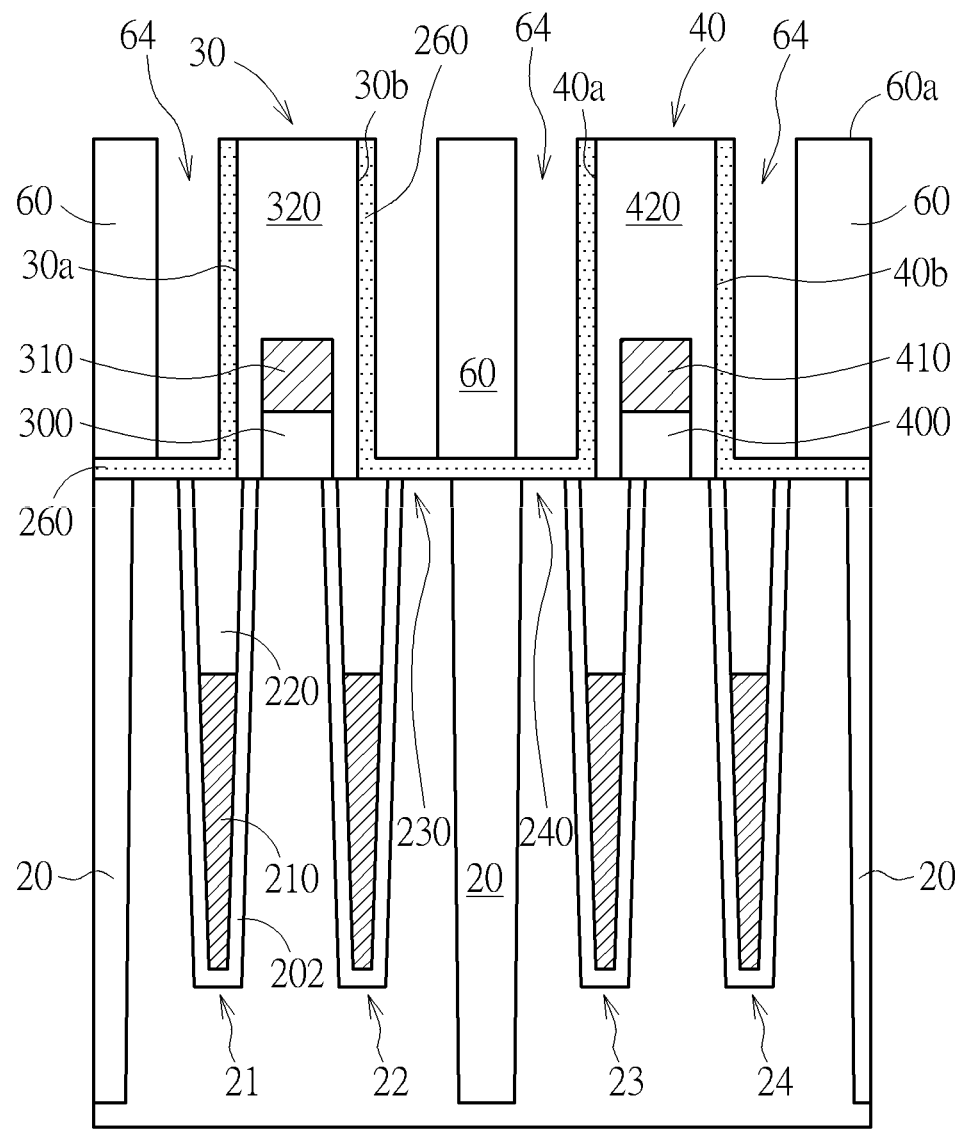

As shown in FIG. 8, according to the illustrative embodiment, an etching process such as a dry etching process may be performed to completely remove the sacrificial layer 50, thereby forming a contact hole 64 in place. At this point, the contact hole 64 exposes a sidewall of the etch stop layer 260, a top surface of the etch stop layer 260 at the bottom of the contact hole 64, and a sidewall of the gap filling material layer 60.

Figure 9:
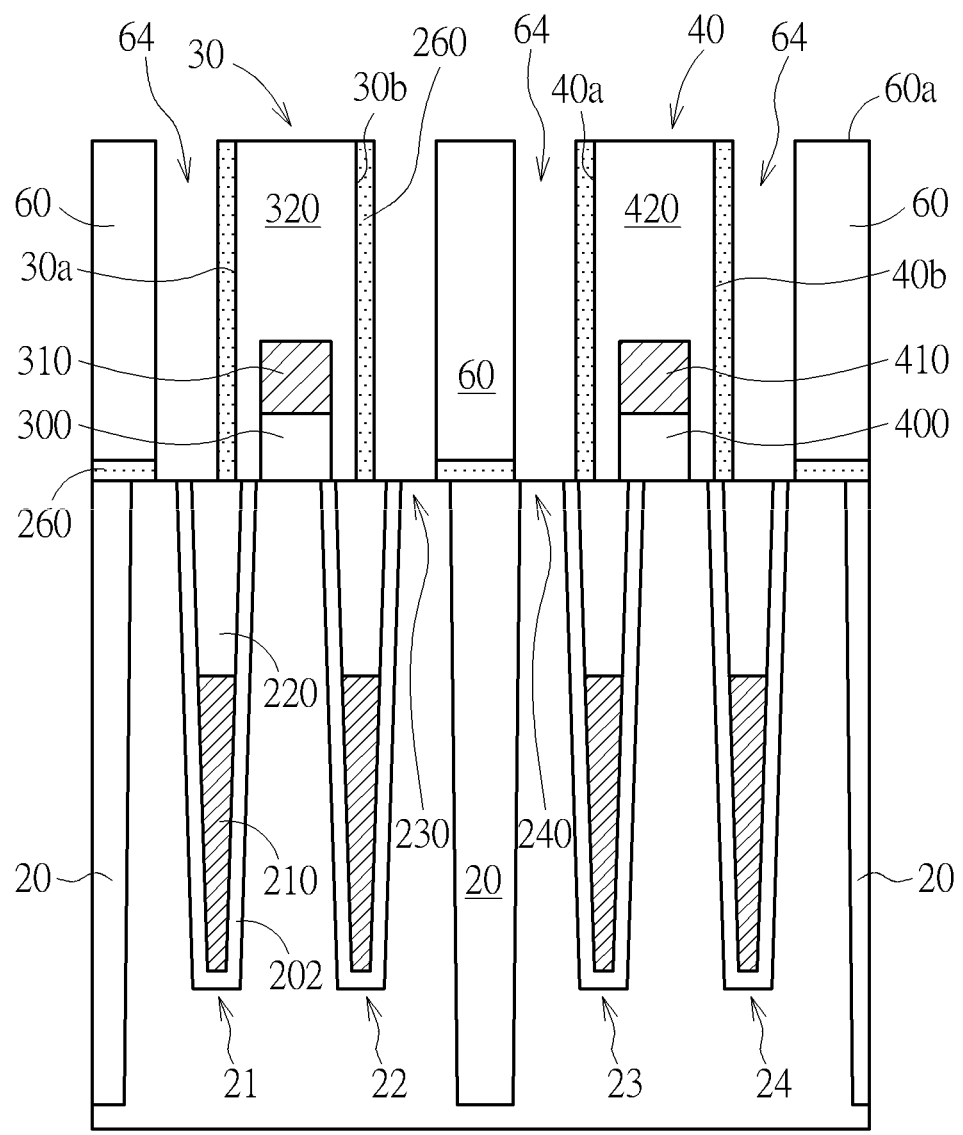

As shown in FIG. 9, according to the illustrative embodiment, a punch etching process is then performed to remove the etch stop layer 260 from the bottom of the contact hole 64, thereby exposing the cell contact regions 230 and 240. According to the illustrative embodiment, the punch etching process may be an anisotropic etching process, but is not limited thereto. According to the illustrative embodiment, the contact hole 64 is formed by a two-stage etching method. By doing this, the active areas including the cell contact regions 230 and 240 are not damaged and the problematic AA clipping issue may be avoided.

Figure 10:
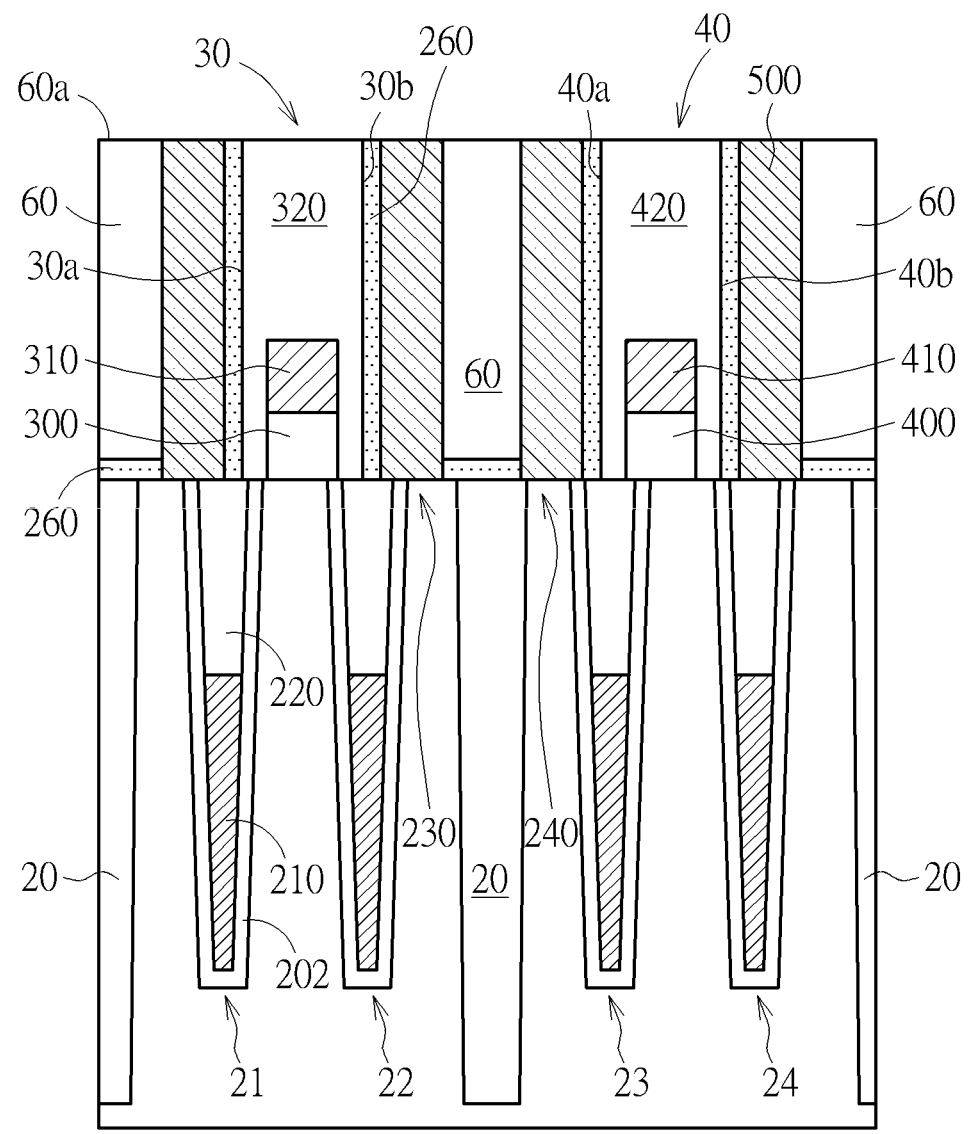

As shown in FIG. 10, after exposing the cell contact regions 230 and 240, at least a conductive material layer is deposited into the contact hole 64. According to the illustrative embodiment, the conductive material layer may comprise polysilicon, metals such as tungsten or titanium nitride, or a combination thereof. The conductive material layer fills up the contact hole 64 and covers the top surfaces of the silicon nitride layers 320, 420 and the top surface 60a of the gap filling material layer 60. Subsequently, a planarization process including, but not limited to, a polishing or an etching process, is performed to remove an upper portion of the conductive material layer until the top surface 60a of the gap filling material layer 60 is exposed, thereby forming cell contact 500 in the contact hole 64.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a cell contact, comprising:
   providing a substrate having a first and a second protruding structures disposed on a major surface of the substrate, wherein the major surface comprises a first cell contact region in close proximity to the first protruding structure and a second cell contact region in close proximity to the second protruding structure;
   depositing a conformal etch stop layer over the substrate, wherein the etch stop layer conformally covers the first and second protruding structures and the first and second cell contact regions;
   depositing a sacrificial layer in a blanket manner on the etch stop layer, wherein the sacrificial layer fills up a gap between the first and second protruding structures;
   recessing the sacrificial layer such that top portions of the first and second protruding structures protrude from a top surface of the sacrificial layer;
   forming spacers on the top surface of the sacrificial layer and on sidewalls of the protrudent top portions of the first and second protruding structures;
   using the spacers as an etching hard mask, etching away a portion of the sacrificial layer not covered by the spacers in a self-aligned manner, thereby forming a recess;
   depositing a gap filling material layer into the recess;
   performing a first planarization process to remove an upper portion of the gap filling material layer and the spacers, and the protrudent top portions of the first and second protruding structures until the top surface of the sacrificial layer is exposed;
   removing the sacrificial layer so as to form contact holes in place;
   performing a punch etching process to remove the etch stop layer from bottoms of the contact holes, thereby exposing the first and second cell contact regions; and
   filling the contact holes with a conductive material layer.

2. The method for forming a cell contact according to claim 1, wherein a trench isolation structure is formed in the substrate between the first cell contact region and the second cell contact region.

3. The method for forming a cell contact according to claim 1, wherein the etch stop layer comprises silicon nitride.

4. The method for forming a cell contact according to claim 1, wherein the sacrificial layer comprises polysilicon.

5. The method for forming a cell contact according to claim 1, wherein the spacers are composed of silicon nitride.

6. The method for forming a cell contact according to claim 1, wherein the first planarization process comprises a polishing process or an etching process.

7. The method for forming a cell contact according to claim 1, wherein the conductive material layer comprises polysilicon, metals, or a combination thereof.

8. The method for forming a cell contact according to claim 1 further comprising:
   performing a second planarization process to remove an upper portion of the conductive material layer until a top surface of the gap filling material layer is exposed.

9. The method for forming a cell contact according to claim 1, wherein the protrudent top portions of the first and second protruding structures comprise a silicon oxide layer.

10. The method for forming a cell contact according to claim 1, wherein trenched gate structures are provided in the substrate under the major surface.

* * * * *